(12) United States Patent
Emslie et al.

(10) Patent No.: US 7,095,180 B2
(45) Date of Patent: Aug. 22, 2006

(54) BACKLIGHTING SYSTEM FOR DISPLAY SCREEN

(75) Inventors: James Stephen Emslie, Hamilton (NZ); Richard William Pease, Manukau (NZ)

(73) Assignee: Deep Video Imaging Limited, Auckland (NZ)

( * ) Notice: Subject to any disclaimer, the term of this patent is extended or adjusted under 35 U.S.C. 154(b) by 0 days.

(21) Appl. No.: 10/714,400

(22) Filed: Nov. 17, 2003

(65) Prior Publication Data

US 2004/0233663 A1 Nov. 25, 2004

(30) Foreign Application Priority Data

May 21, 2003 (NZ) ..................... 526028

(51) Int. Cl.
*H05B 37/00* (2006.01)
*G02F 1/1335* (2006.01)
(52) U.S. Cl. ........................ 315/161; 349/70
(58) Field of Classification Search ............... 315/161, 315/291, 299, 307, 312, 324; 349/56, 58, 349/69–70, 158; 345/80, 102
See application file for complete search history.

(56) References Cited

U.S. PATENT DOCUMENTS 5,432,626 A * 7/1995 Sasuga et al. ............... 349/58
6,326,738 B1 12/2001 McAndrew ............. 315/227 R
6,504,587 B1 * 1/2003 Morishita et al. ............. 349/58

FOREIGN PATENT DOCUMENTS

WO    WO 99/42889    8/1999

* cited by examiner

*Primary Examiner*—Thuy Vinh Tran
(74) *Attorney, Agent, or Firm*—Lowe Hauptman & Berner, LLP (57) ABSTRACT

A circuit board (14) on which the electronic components (2,3) providing power to a series of light sources (6) is positioned as near as possible to light sources in order to minimise parasitic energy losses which would be introduced by lengths of wiring. The light sources (5) are usually elongate tubular Cold Cathode Fluorescent Tubes arranged parallel to one another in a single plane and the circuit board (14) may be mounted directly over the light sources, towards one end of the tubes. Standard PCB board-to-board connectors (12) may be provided at an edge of the circuit board (14) and a further circuit board (10) provided with a series of conductive tracks may provide both a mechanical and electrical connection between the circuit board (14) and the light sources (5). A power distribution method is also disclosed in which both current and temperature of the light sources are monitored and regulated in order to extend the lifetime of the light sources (5) and to stabilize their brightness.

20 Claims, 6 Drawing Sheets

BACKLIGHTING SYSTEM FOR DISPLAY SCREEN

TECHNICAL FIELD

This invention relates to display apparatus and in particular, though not solely, to the backlighting system employed in display apparatus such as LCD display screens, more particularly, multi-layer display (MLD) screens.

BACKGROUND ART

Certain types of display apparatus, such as Liquid Crystal Display (LCD) screens used as computer screens or television screens, require backlighting in order to make display elements on the screen visible, or more easily visible, to a viewer of the display unit.

Existing "flat" screen display units, for example LCD display screens, may be single-layer display (SLD) units having a single display layer or single planar array of liquid crystal pixels, or multi-layer display (MLD) units in which a number of planar arrays of LCD pixels are aligned in a stacked or sandwiched arrangement. Multi-layered display (MLD) units provide a significant improvement over existing single layer display (SLD) units or displays. MLD units may be used to nest display content over spacially displaced or stacked layers to provide an enhanced mechanism for information absorption and analysis by users. An example of an existing multi-layer display is discussed for example in WO9942889A.

Existing MLD units require a significant amount of light to illuminate images on the foreground layer (closest to the viewer) through the previous or lower layers. Often cold cathode fluorescent lamps (CCFT) are used to provide the backlight in SLD and MLD LCD display units and these require supporting circuitry to generate an initial high starting voltage and a subsequent lower maintenance voltage once the lamps are in sustained discharge mode. This support circuitry and the tubes generate excess heat within the display apparatus and due to the proximity of the power supply wires required, power is wasted through currents produced as a result of parasitic capacitive coupling. These problems result in a need to provide a relatively high capacity and quality power supply in existing backlit display apparatus and often also results in the need to incorporate cooling components to remove the excess heat produced.

In CCFT lamps, ultra-violet (UV) light is produced via an electrical discharge passing through Argon and Mercury vapour in the lamp. The UV light reacts with a phosphor coating on the inside of the glass lamp which converts the UV light to visible light. The phosphor blend determines the spectral content of the visible light produced by the lamp.

A high voltage is required to initiate the self-sustaining electrical discharge through the gas vapour and, once started, a lower voltage is required to keep the discharge going. Power is supplied to the lamp through a ballast capacitor which ensures that the power supply sees the lamp as a linear electrical load. The total luminous flux produced by the lamp is dependent on the magnitude of the current through the lamp and the cold spot temperature of the lamp. The optimal temperature range for the lamp is between about 45 and 55° C. while the optimal current range is between about 5 and 7 mA. If the temperature and/or current are outside these ranges then the light output and life of the lamp will decrease.

MLD units have many more lamps than SLD units. For example, an MLD unit may have between 24 and 27 lamps. Conventionally, wires are used to attach an inverter to a lamp (or set of lamps) to its power supply. Two wires are required per lamp which results in a large number of wires which is cumbersome, messy, produces excessive Electromagnetic Interference (EMI) and results in power loss through the above mentioned capacitive coupling, particularly in MLD units because of the increased number of lamps.

U.S. Pat. No. 6,326,738B discloses a backlighting system for an SLD unit in which the ballast capacitor is mounted on the circuit board substrate to which one end of the lamp is connected, thereby reducing the number of wires required. This system allows two wires to be used to supply power to all of the lamps in a backlighting system but results in bright and dark spots and variance as power can not be regulated easily to ensure that each lamp receives the same amount of power. Power is also lost in this system due to the introduced parasitic capacitance between the supply wires and the metallic enclosure which is required. Furthermore, the system disclosed requires higher rated electronic components such as inverters which are physically larger and more expensive.

It is therefore an object of the present invention to provide a backlighting system which goes at least some way towards overcoming the above disadvantages or which will at least provide the public with a useful choice.

All references, including any patents or patent applications cited in this specification are hereby incorporated by reference. No admission is made that any reference constitutes prior art. The discussion of the references states what their authors assert, and the applicants reserve the right to challenge the accuracy and pertinency of the cited documents. It will be clearly understood that, although a number of prior art publications are referred to herein, this reference does not constitute an admission that any of these documents form part of the common general knowledge in the art, in New Zealand or in any other country.

It is acknowledged that the term 'comprise' may, under varying jurisdictions, be attributed with either an exclusive or an inclusive meaning. For the purpose of this specification, and unless otherwise noted, the term 'comprise' shall have an inclusive meaning—i.e. that it will be taken to mean an inclusion of not only the listed components it directly references, but also other non-specified components or elements. This rationale will also be used when the term 'comprised' or 'comprising' is used in relation to one or more steps in a method or process.

DISCLOSURE OF INVENTION

Accordingly, in a first aspect, the invention consists in a backlighting system for a display apparatus comprising:
  at least one light source,
  electronic componentry adapted to receive electrical power and to control the distribution of electrical power to the at least one light source,
  first and second circuit board substrate on which the electronic componentry is mounted and including an arrangement of conductive tracks, and
  electrical connection means provided in the circuit board substrate and connected to said conductive tracks,
  wherein said electrical connection means is directly electrically and physically connected to the at least one light source to conduct said electrical power distributed by the electronic componentry to said at least one light source, and further electrical connection means are provided between said first and second circuit board substrates.

Preferably, the light source is provided substantially in a display plane and the first circuit board substrate is substantially planar and positioned over the at least one light source substantially parallel with the display plane.

Preferably, the second circuit board substrate is arranged substantially perpendicularly to the plane of the first circuit board substrate and the display plane.

Preferably, said at least one light source comprises a plurality of tubular light sources having proximal and distal ends, the tubular light sources aligned in a row and substantially in the same plane as the first circuit board substrate, the distal ends of the plurality of tubular light sources connected together and to a ground connection of the electronic componentry and the proximal ends connected to receive electrical power from the electronic componentry through the electrical connection means.

Preferably, said first circuit board substrate includes at least one substantially straight edge adjacent to which said further electrical connection means is provided, the further electrical connection means including mechanical connection means provided on the first circuit board substrate along the substantially straight edge and including conductive pin means providing at least part of said further electrical connection means.

Preferably, said mechanical connection means comprise standard board to board connectors.

Preferably, said electronic componentry includes a plurality of control means, each of which control the distribution of power to more than one light source, each control means receiving feedback of the electrical power consumption of its selected number of light sources and adjusting the power supplied to the selected number of light sources accordingly.

Preferably, the electronic componentry includes inverters, each control means controls more than one inverter and each inverter powers more than one light source.

Preferably, a cooling means is also provided wherein said control means also receives feedback on a temperature within the display apparatus and adjusts the amount of cooling provided to at least said selected number of light sources by said cooling means accordingly.

Preferably, the display apparatus is a multi-layer display.

In a further aspect, the invention consists in a power distribution system for at least one light source within a display apparatus wherein a control means controls the distribution of power to the at least one light source by carrying out the steps of:

i) detecting the electrical power consumed by the at least one light source,
ii) determining whether the electrical power consumed by the at least one light source is within predetermined limits,
iii) regulating the electrical power supplied to the at least one light source based upon the detected power consumption to maintain or return the power consumed by the at least one light source between said predetermined limits, and
iv) repeating steps (i) to (iv).

Preferably, the step of regulating the electrical power supplied to the at least one light source comprises providing the light source with a first light source brightness controlling power signal and a second light source current controlling power signal.

Preferably, said display apparatus includes a plurality of control means, each of which are connected to an associated inverter to control the power distributed to more than one fluorescent light source, wherein a capacitor associated with each fluorescent light source and its associated inverter.

Preferably, the power consumed by the at least one light source is determined by sensing the current through the at least one light source.

Preferably, said display apparatus also includes a temperature sensor which provides said control means with an indication of the temperature in the vicinity of the at least one light source and the control means also carries out the steps of:

iia) determining whether the temperature of the at least one light source is within predetermined limits, and
iiia) adjusting the power supplied to the at least one light source based upon the temperature indication to maintain or return the temperature of the at least one light source between said predetermined limits.

Preferably, the display apparatus also includes cooling means adapted to provide variable cooling to the at least one light source, wherein the control means also carries out the step of:

iiib) controlling the electrical power supplied to the cooling means based upon the temperature indication to maintain or return the temperature of the at least one light source between said predetermined limits.

Preferably, the respective steps of regulating and adjusting the electrical power supplied to the at least one light source and the step of controlling the power supplied to the cooling means occur by pulse width modulating the current or voltage supplied to the at least one light source or the cooling means respectively.

Preferably, the pulse width modulation frequency employed in the step of regulating the power supplied to the at least one light source is greater than the pulse width modulation frequency employed in the step of adjusting the power supplied to the at least one light source.

Preferably, the pulse width modulation frequency employed in the step of regulating the power supplied to the at least one light source is sufficiently high that the current supplied to the at least one light source, after being filtered by the Inverter, is at a substantially constant analogue or DC level.

BRIEF DESCRIPTION OF DRAWINGS

Further aspects of the present invention will become apparent from the following description which is given by way of example only and with reference to the accompanying drawings in which:

FIG. 2a is a basic schematic block diagram of a circuit layout of the electronic components associated with a single controller and inverter used in the backlighting system shown in FIG. 1a;

FIG. 3 is a basic schematic block diagram of a circuit layout of the electronic components, including all of the inverters and controllers used in the backlighting system of FIG. 1a;

FIG. 4b is a flow diagram showing the steps and decisions involved in the "Update fan LF PWM Control" step of the flow diagram of FIG. 4a;

FIG. 4c is a flow diagram showing the steps and decisions involved in the "Update backlight HF PWM Control" step of the flow diagram of FIG. 4a;

FIG. 5b is a series of waveform diagrams for some of the electrical signals in FIG. 5a.

BEST MODES FOR CARRYING OUT THE INVENTION

Figure 1A:
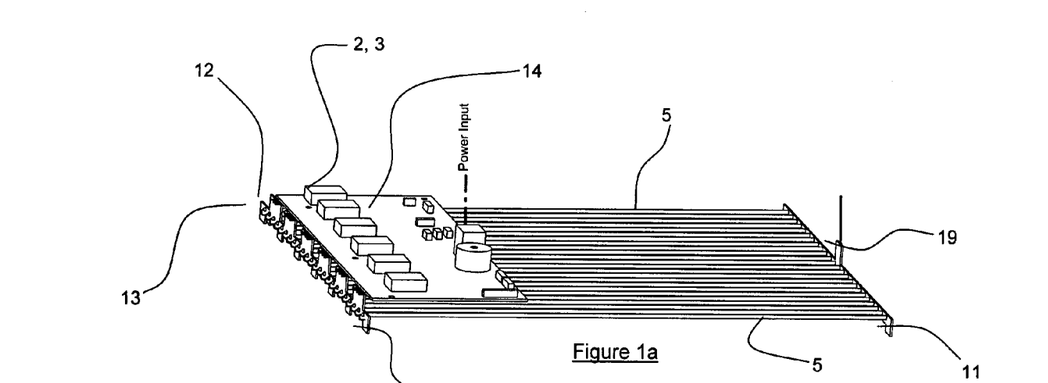
FIG. 1a is a perspective view of the backlighting system for a display apparatus in accordance with a preferred embodiment of the present invention.
Figure 1B:
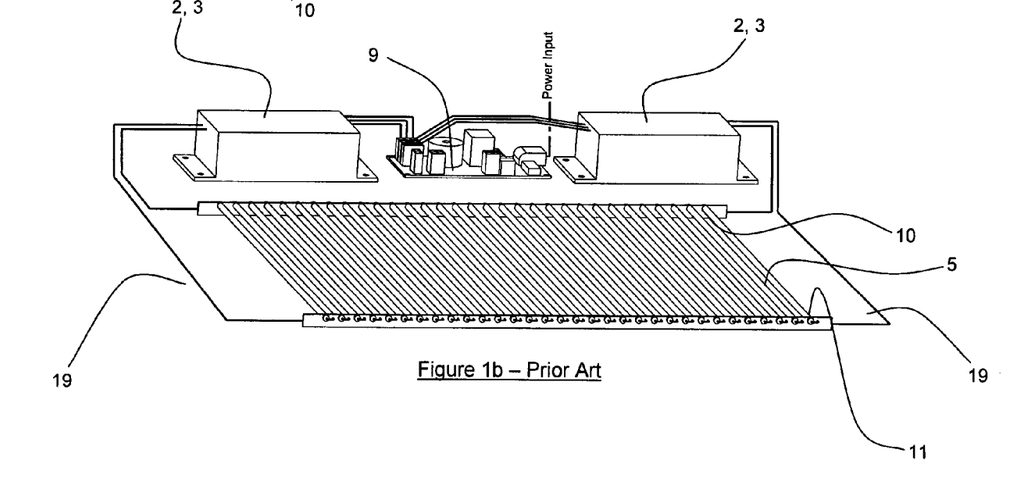
FIG. 1b is a perspective view of a prior-art backlighting system for a display apparatus.
Figure 2A:
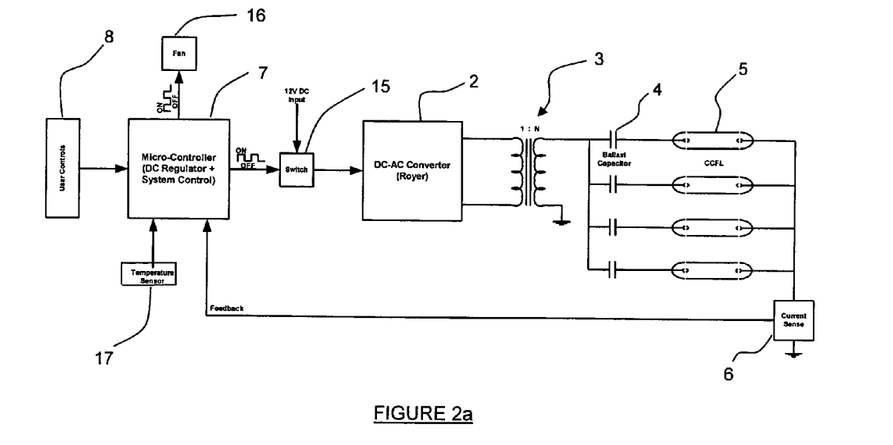
Figure 2B:
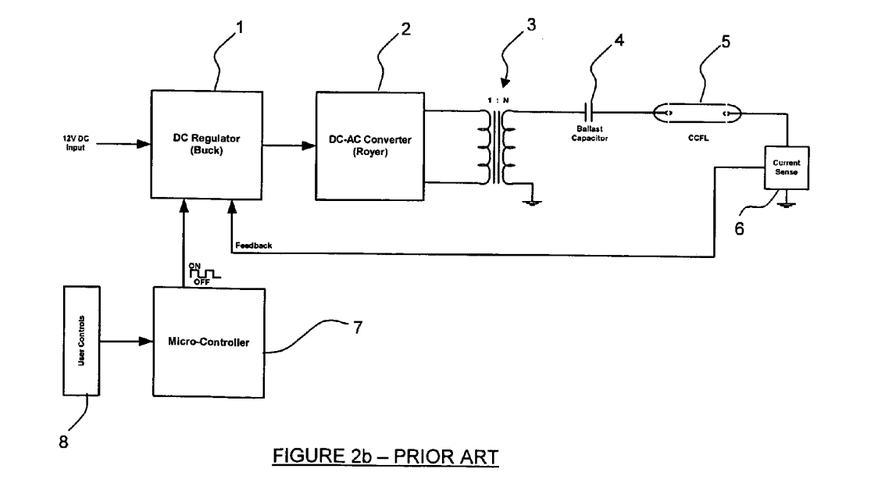
FIG. 2b is a basic schematic block diagram of a circuit layout of the electronic components associated with a single controller and associated inverter used in a prior-art backlighting system.

With reference initially to FIGS. 1b and 2b, examples of a backlighting system and basic circuit block diagram according to the prior-art for controlling the power distribution to a series of light sources such as fluorescent lamps, and in particular Cold Cathode Fluorescent Tubes (CCFT) or lamps, are shown. The prior-art backlighting system includes a regulator 1 which receives DC input power and controls the amount of this input power fed to a royer 2. The royer 2 converts the DC voltage output by regulator 1 to an AC voltage which is boosted by a transformer 3. Commonly, the combination of royer and transformer is known as an inverter.

A ballast capacitor 4 is positioned between the secondary side of the transformer and one end of the or each lamp 5 and is required In order to establish a starting voltage and make the lamp appear as a linear electrical load to the regulator/royer combination. Regulator 1 enables the backlighting system to regulate or control the brightness of the lamp and receives feedback of the current through the lamp from a current sense resistor 6. Regulator 1 typically has a very simple control algorithm such as inverse proportional control wherein the reciprocal of the feedback signal is subtracted from the regulator input. An external microcontroller 7 receives user input (such as brightness and contrast changes) from controls 8 and provides control signals to the regulator 1 in order to adjust the current supplied to the lamp 5.

It can be seen that the majority of the electronic components are mounted on a circuit board substrate or printed circuit board (PCB) 9 although inverters 2,3 are shown mount d separately from the PCB 9. The lamps 5 are all mount d with their longitudinal axes parallel to one another and in the same plane. A first lamp-end circuit board 10 which may include the ballast capacitors 4 connects together the proximal ends of various of the lamps and a second lamp-end circuit board 11 connects together all of the distal ends of the lamps to ground wire 19. In FIG. 1b, half of the lamps receive power from a first inverter 2,3 while the other half of the lamps receive power from a second inverter 2,3. However, further inverters could be used to individually supply a larger number of groups of lamps and this would result in a larger number of wires running between inverters and lamp ends.

The lamp arrangement need not be a parallel series of tubular lamps. The lamps may be generally tubular but "bent" into, for example, generally "S" or "W" type planar shapes in a similar way to Neon sign writing. It will be understood that a single "S" shaped planar lamp may replace the space occupied by three straight tubular lamps but will require a third of the associated electronic componentry. A planar generally "S" shaped lamp will therefore produce less heat and will start and finish at different tube end circuit boards 10, 11. In contrast, a planar generally "W" shaped lamp will replace the space occupied by four straight tubular lamps but require a quarter of the electronic componentry. Generally however, the arrangement of tubes will be substantially planar (in a display plane) to minimise the thickness of the display apparatus.

With reference now to FIGS. 1a and 2a, in accordance with a preferred embodiment of the present invention, a circuit board substrate or PCB 14 is provided for mounting each of the electrical components forming the power supply for the lamps 5. It can be seen that the PCB 14 is preferably mounted over the lamps, substantially parallel to the plan of the lamps. The wires shown in FIG. 1b have been removed and instead, contact means such as, for example short mechanical connection means such as standard PCB board-to-board connectors 12, each having a plurality of relatively short and substantially inflexible protruding links or conductive pins 13 are provided on PCB 14 which directly contact lamp end circuit board 10. The board-to-board connectors 12 are provided along a substantially straight edge of the PCB 14 and each receives the output from a respective ballast capacitor 4 mounted on PCB 14. The proximal lamp-end circuit board 10 has been altered to receive the conductive pins which are connected thereto and conductive tracks are provided on PCB 10 between the respective conductive pins 13 and the respective ends of a group of, for example four, lamps.

The length of links 13 between PCB 14 and the lamps is minimised to reduce parasitic power losses due to capacitive coupling. Using board-to-board connectors keeps the length of all the tracks between the inverters 2,3 and lamps 5 approximately the same so that the intensity of visible light produced by each of the lamps will be substantially the same. As a result of the construction shown in FIG. 1a, the backlighting system according to the present invention is less bulky. The reduction in the number of wires which would otherwise be necessary also improves safety as the internal temperature in an MLD or SLD unit is elevated due to the number of light sources required. Furthermore, the serviceability of MLD or SLD units incorporating the present invention is improved as it is possible to replace the lamps all at once by virtue of the inclusion of board-to-board connectors. The PCB 14 is also of an improved mechanical shape (that is, wide and flat) in comparison to the board 9 of FIG. 1b so heat conduction is improved as a result of a larger surface area. There is also no need for a person to manually solder components in the backlighting system of the present invention as a machine can surface mount all of the components. It should be noted that the present invention is applicable to both single- and multi-layer displays.

Alternatively in certain configurations the inverters 2,3 and lamps 5 could be attached board to board without the need for connectors 12 with the same advantages. That is, the PCB 14 and lamp-end board 10 could be integrally provided, for example by forming PCB 14 in a substantially "L" shape to incorporate the function of circuit boards 10 and 14 or substantially "U" shape to incorporate the functionality of circuit boards 10, 11 and 14.

FIG. 2a demonstrates the layout of electronic components within the backlighting system's power supply for only one of the inverters 2,3 according to a preferred embodiment of the present invention. It can be seen that the control means or microcontroller 7 now also incorporates the function of regulator 1. Preferably, controller 7 executes predetermined conditional steps or software (to be described below) stored in an associated storage device either within or associated with controller 7 and, in response to certain inputs, provides a modulated or pulsed or PWM output signal to a switch 15 which, in response, provides a modulated or pulsed or PWM input DC voltage signal (for example 12 volts DC maximum) to royer 2 which effectively controls the brightness of the lamp(s).

It can clearly be seen that a single inverter 2,3 in the layout according to the present invention may provide power to more than one lamp 5 and that the voltage across the current sense resistor 6 provides an indication of the total current through all of the lamps in the group connected to that particular inverter 2,3. The position of the current sense resistor could be moved from the distal ends of the lamps to, for example, adjacent the secondary side of the transformer 3, in which case, it would be possible to reduce the length of the wires connecting the controller 7 and the current sense resistor 6.

It can also be seen in FIG. 2a that a cooling means such as a variable speed fan 16 is also receives input from controller 7. The fan 16 is adapted to provide variable cooling to the lamps 5 which produce a large amount of heat in use and th fan speed may be controlled, for example, by a PWM signal provided by the controller 7. A temperature sensor 17 is provided in the vicinity of the lamps or a number of temperature sensors are provided, one for each group of lamps, which provides a temperature signal indicative of a temperature within the display apparatus to the controllers or the controller associated with the particular group of lamps for which it is detecting the temperature. Other ambient sensors such as brightness may also be incorporated and provide feedback to the controller 7 which will adjust the power supplied to (and thereby the brightness of) the lamp (s) accordingly.

Figure 3:
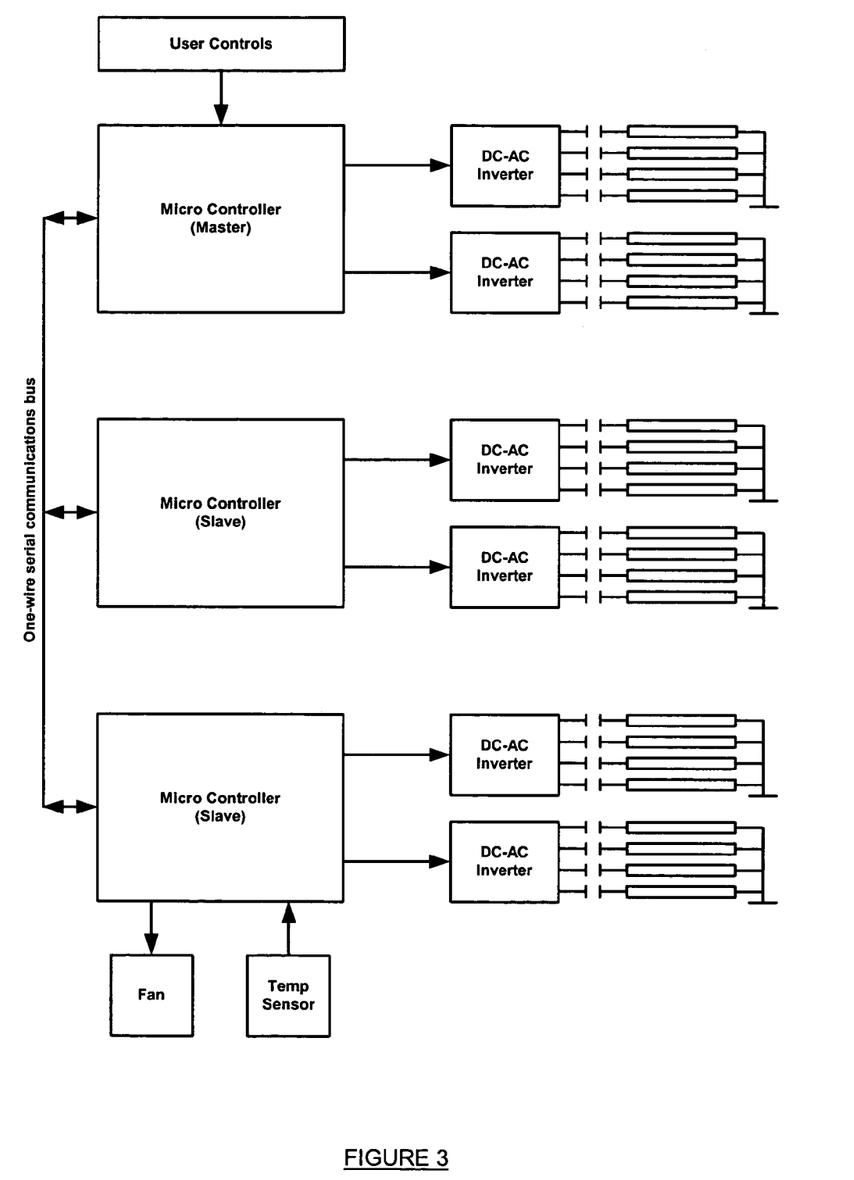

With reference now to FIG. 3, it can be seen that in one embodiment of the present invention, three separate controllers 7 are provided, each of which provides output control signals to two separate inverters 2,3 and each inverter 2,3 provides a regulated voltage to four separate lamps. Input signals from a user (such as on/off and brightness and contrast change requirements) are received via the user controls 8 and ambient parameters such as temperature are provided to the controllers 7 via sensors such as temperature sensor 17 while output control signals are issued to external devices such as fan 16. Although switch 15 is not illustrated in FIG. 3, its function may still be incorporated.

The input signals may be communicated to each of the controllers via a communication bus interconnecting all controllers and output signals to external devices (such as the fan 16) may be communicated directly via a particular controller connected to that external device, or, one of the controllers (a "master" controller) may generate the output signal and this may be transmitted via the communications bus 18 to a particular ("slave") controller to which the external device is connected and the control signal then passed to the external device from that slave controller. The communications bus 18 may be a single wire, With reference to the flow diagrams of FIGS. 4a, 4b and 4c, the control algorithm or software executed by the or each controller in accordance with a further aspect of the present invention will now be described.

Figure 4A:
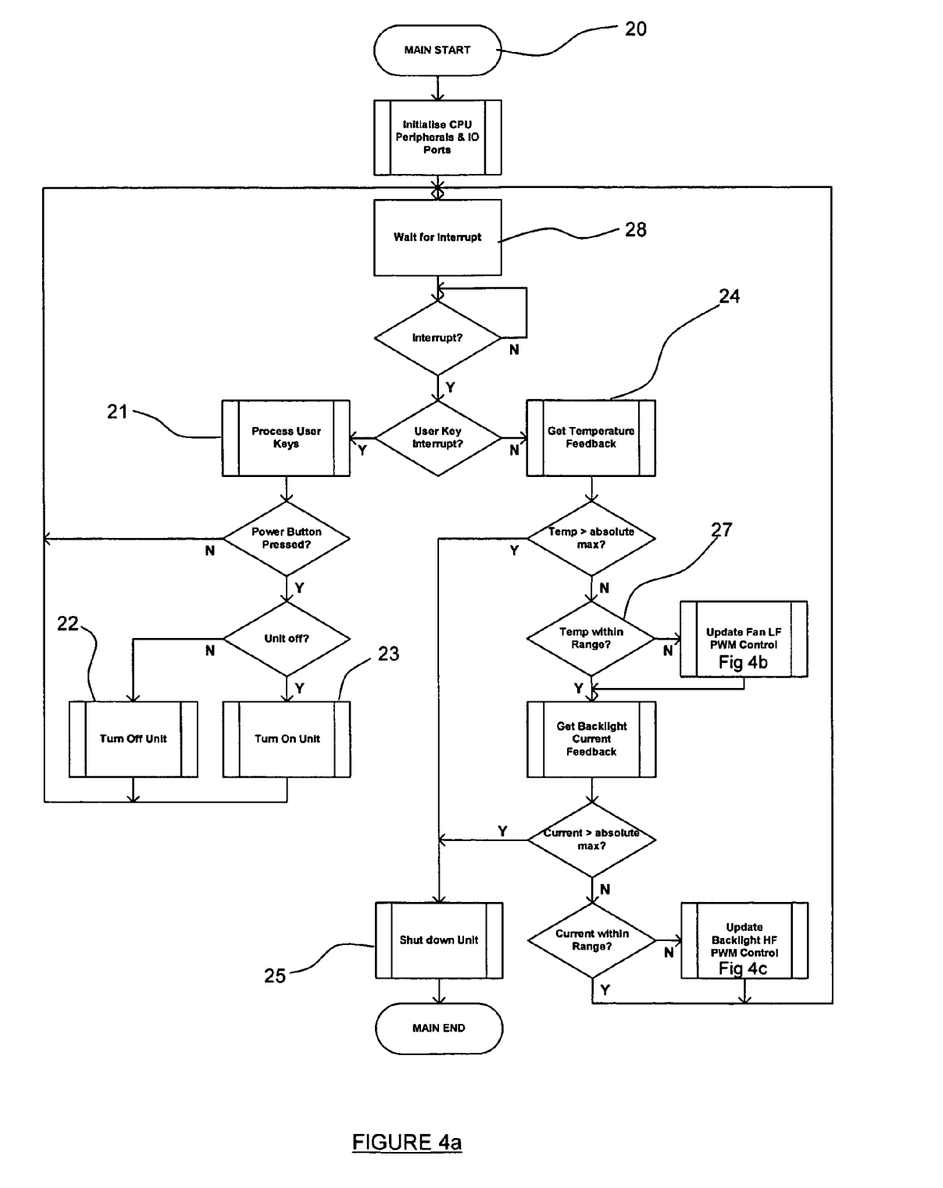
FIG. 4a is a flow diagram showing the main steps and decisions involved in the operation of the power distribution/control system for the backlighting system of FIG. 1.

In FIG. 4a, execution starts at block 20 and proceeds to the step of initialising the controller(s) or CPU(S) and then waits for an interrupt to occur at block 28. The interrupt may be a user interrupt such as the user providing input via an on/off switch or brightness or contrast adjustment input device in which case control passes to a series of steps starting with block 21 and the MLD unit is, for example turned off or on in blocks 22 and 23 respectively.

Alternatively, the interrupt may be timed or automatic and results in the controller reading the temperature from sensor 17 at block 24. If the temperature is greater than a predetermined maximum temperature then the MLD unit is turned off at block 25 to avoid damage to the unit.

In block 26 a decision is made as to whether the temperature is within a predetermined allowable or desirable temperature range. If the temperature is not within that predetermined range then control passes to the flow chart of FIG. 4b which will be described below in which the cooling provided by the fan and/or the brightness of the lamps are adjusted in order to bring the temperature back to within the allowable range. If the temperature is found to be within the allowable range, then the lamp current is sensed via current sense resistor 6 at block 27. Again, if the current is found to be above an absolute predetermined maximum current then the MLD unit is turned off at block 25 in order to minimise damage to the unit.

If the lamp current determined at block 27 is determined to be within a desired or allowable range (such as between 5 and 7 mA) then control returns to block 28 to wait for a further interrupt to occur. If however the current is found to be outside the predetermined range then control passes to the flow diagram of FIG. 4c in which lamp current is regulated as will be described further below.

Figure 4B:
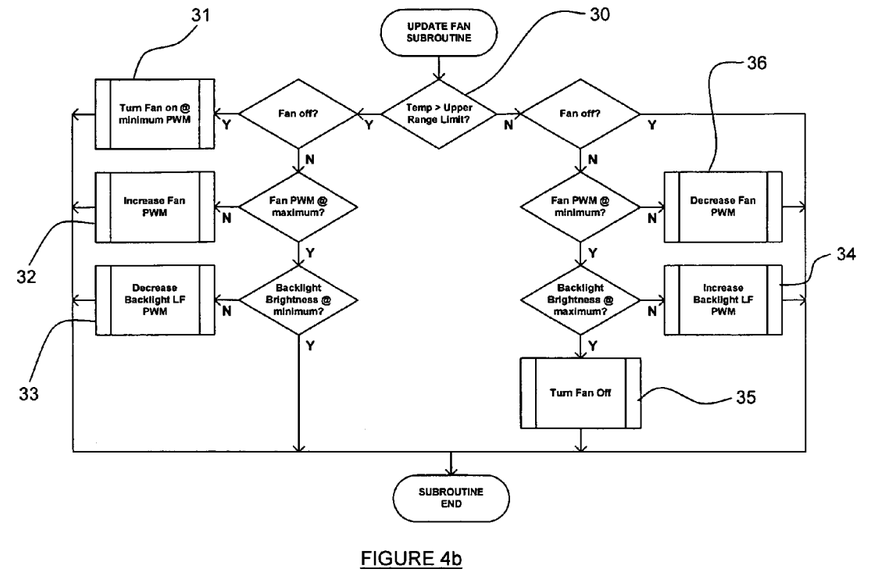

As mentioned above, in order to commence the flow diagram of FIG. 4b, the temperature sensor must have sensed a temperature outside the preset range but less than the absolute maximum temperature. A decision is then made in block 30 as to whether the temperature is above the upper limit of the predetermined allowable range. If the temperature is above the upper limit, and the fan is currently turned off, then the fan is turned on at a minimum PWM duty cycle in block 31 (the duty cycle may be defined as the ON time divided by the sum of the ON time and OFF time in one cycle of the PWM waveform—100% duty cycle Is fully on and 0% duty cycle is fully off). Control then returns to block 27 in the flow diagram of FIG. 4a.

If the temperature is above the upper limit and the fan is currently on and the current duty cycle of the PWM control signal to the fan is below a predetermined maximum, then the duty cycle is increased by a predetermined amount in block 32 to slightly increase the fan speed and its cooling effect and control returns to block 27 in the flow diagram of FIG. 4a.

If the temperature is above the upper limit and the fan is currently on and the current duty cycle of the PWM control signal to the fan is at its predetermined maximum, then a decision is made in block 33 as to whether the lamp brightness is at a minimum. If the lamp brightness is not at its minimum then the lamp brightness is incrementally reduced at block 33 by reducing the duty cycle of a first PWM power signal output by the controller(s). This first power signal is at a comparatively low frequency, for example 200 Hz. Given a constant lamp current, adjustment of the duty cycle of this low frequency PWM signal regulates the brightness of the lamp(s). Effectively, the low frequency PWM signal turns the lamp(s) on and off at a rate which the human visual system can not detect and at a rate at which the electronic components can not smooth or filter down to a constant analogue or DC level. Control then returns to block 27 in the flow diagram of FIG. 4a.

If the fan is on, the duty cycle of the fan's PWM signal is at its maximum and the backlight brightness is at its minimum (that is, the duty cycle of the first PWM signal is at its minimum preset value), then control returns to block 27 in the flow diagram of FIG. 4*a*.

If at block 30 it is found that the temperature is less than or equal to the upper temperature limit and the fan is turned off then control returns to block 27 in the flow diagram of FIG. 4*a*.

If at block 30 it is found that the temperature is less than or equal to the upper temperature limit and the fan is on and operating above its minimum PWM duty cycle then the duty cycle of the fan's PWM signal is incrementally decreased at block 36 to reduce its speed and cooling effect and control returns to block 27 in the flow diagram of FIG. 4*a*.

If at block 30 it is found that the temperature is less than or equal to the upper temperature limit and the fan is on and operating at its minimum PWM duty cycle and the backlight brightness is below its maximum (that is, the duty cycle of the first PWM signal is at below its maximum preset value) then the duty cycle of the low frequency PWM power signal is incrementally increased at block 34 to slightly increase the brightness of the lamp and control then returns to block 27 in the flow diagram of FIG. 4*a*.

If at block 30 it Is found that the temperature is less than or equal to the upper temperature limit and the fan is on and operating above its minimum PWM duty cycle and the backlight brightness is at its maximum then the fan is turned off at block 35 and control returns to block 27 in the flow diagram of FIG. 4*a*. This is the ideal operating situation in which the temperature of the lamp is within its range, the fan is off and the lamp is at its brightest.

Figure 4C:
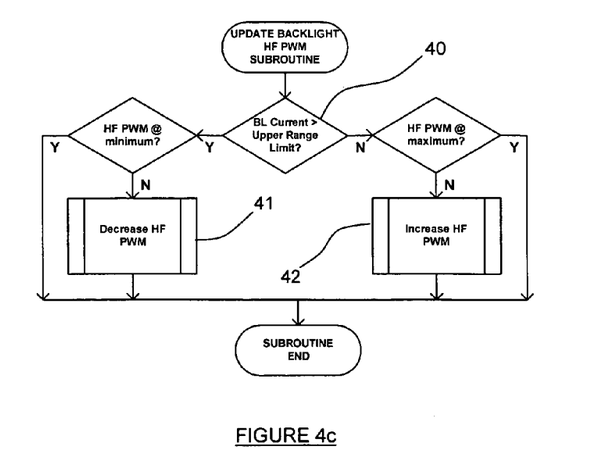

As mentioned above, in order to commence the flow diagram of FIG. 4*c*, the current sense resistor 6 must have sensed a lamp current outside the preset range but less than the absolute maximum allowable current. A decision is then made in block 40 as to whether the current is above the upper limit of the predetermined allowable range.

If the current is above the upper limit of the allowable range and the duty cycle of a second PWM power signal output by the controller(s) is above a preset minimum duty cycle, then the duty cycle of this second PWM power signal is incrementally decreased at block 41. This second PWM power signal is at a comparatively high frequency, for example 50 kHz and directly regulates or determines the size of the lamp current. Because the frequency of this second PWM signal is relatively high, the electronic components (such as capacitors and inductors) within the power supply circuitry smooth or filter this signal to a constant analogue or DC signal level. Accordingly, if the duty cycle of this second PWM power signal remains constant then a constant lamp current will flow and a constant lamp brightness will result which will in turn increase the life of the lamp.

It will be noted at this point that the first and second PWM power signals are separately generated but are applied to the inverter(s) 2,3 in superposition.

If the lamp current is above the upper limit of the allowable range and the second, high frequency PWM power signal is at its minimum duty cycle, then control returns to block 28 of FIG. 4*a* to wait for a further interrupt.

If the lamp current is found at block 40 to be less than or equal to the upper value of the allowable current range and the duty cycle of the high frequency PWM signal is not at its maximum preset value, then the duty cycle of the high frequency power signal is incrementally increased and control then returns to block 28 of FIG. 4*a*.

Finally, if the lamp current is found at block 40 to be less than or equal to the upper value of the allowable current range and the duty cycle of the high frequency PWM signal is at its maximum preset value, then control returns to block 28 of FIG. 4*a* to wait for a further interrupt.

The present invention, at least in its preferred form provides a number of advantages over the prior art. The reduction of the number and length of wiring reduces th amount of power loss through EMI and capacitive coupling and therefore allows the power rating of the power supply to be reduced or additional lamps to be added to the backlighting system. The positioning of the circuit board substrate in the present invention also beneficially minimises the footprint of the backlight system. The control algorithm of the controller in accordance with the present invention ensures that the power supplied to the various lamps within the backlighting system are balanced so that a consistent brightness of the display screen may be obtained across its entire surface area. The control algorithm also extends the operating life of the lamps by maintaining their operating temperature and current within allowable parameters.

Figure 5A:
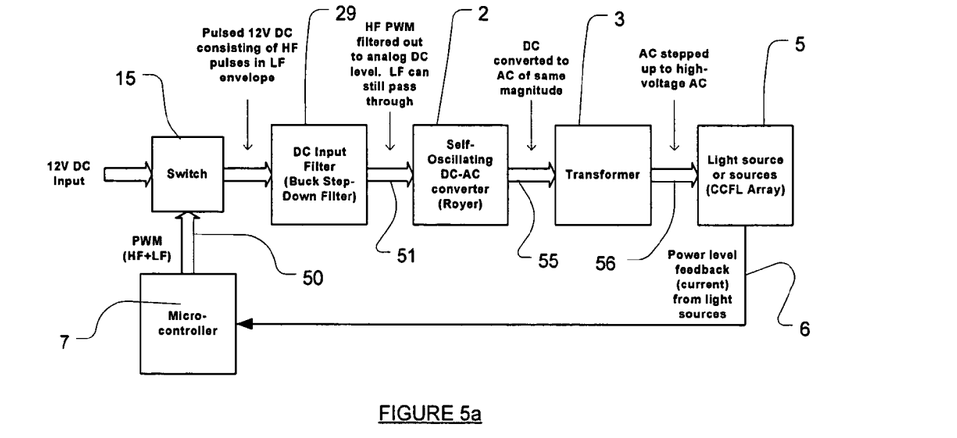
FIG. 5a is a basic schematic block diagram of a portion of the circuit layout shown in FIG. 2a illustrating the types of electrical signals existing at various parts of the circuit.
Figure 5B:
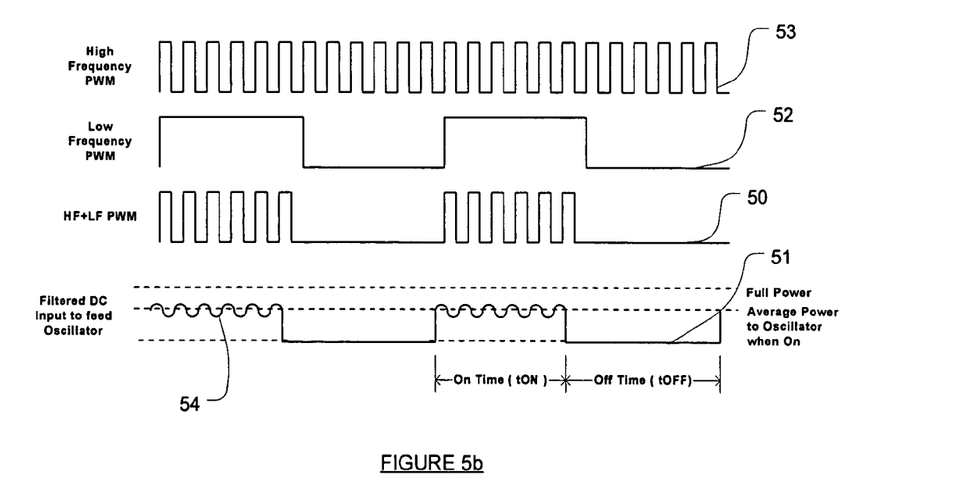

FIGS. 5*a* and 5*b* demonstrate the types and waveforms of electrical signals at various positions throughout the electrical circuit in the preferred embodiment of the present invention. In FIG. 5*a* an additional circuit element of a DC input filter 2*a* has been illustrated (although this could form part of the inverter 2,3) which effectively smoothes or filters the superposed low 52 and high 53 frequency PWM power signals.

FIG. 5*b* illustrates the way in which the low 52 and high 53 frequency PWM signals are combined and filtered. The duty cycle of the example signals 52 and 53 shown in FIG. 5*b* is approximately 50% (that is, $t_{ON} \approx t_{OFF}$). Preferably, the low and high frequency signals are effectively logically ANDed together so that signal 50 is high only if both signals 52 and 53 are high at the same time. The output of switch 15 is therefore a pulsed 12V DC signal consisting of high frequency pulses in a low frequency envelope having substantially the same shaped waveform as signal 50.

Ripples 54 appear in waveform 51 as a result of the filtering or smoothing of the high frequency component of the combined signal 50. Royer 2 converts waveform 51 to an AC signal 55, preferably without altering its magnitude significantly. Transformer 3 then steps up the AC signal to a higher voltage AC signal 56 for supply to th light source 5 or sources of the display apparatus.

It should be noted that the present invention could incorporate light sources other than CCFT lamps which require Energisation via an AC current. For example, light sources in which the output brightness is dependent upon the magnitude of an AC or DC voltage could be utilised in which case it may not be necessary to provide inverters 2,3, Aspects of the present invention have been described by way of example only and it should be appreciated that modifications and additions may be made thereto without departing from the scope thereof.

The invention claimed is:

1. A backlighting system for a display apparatus, said backlighting system comprising:
    at least one light source;
    electronic componentry adapted to receive electrical power and to control the distribution of electrical power to the at least one light source;
    at least one circuit board substrate on which the electronic componentry is mounted and including an arrangement of conductive tracks; and electrical connection means provided in the circuit board substrate and connected to said conductive tracks, wherein said electrical connection means is directly electrically and physically connected to the at least one light source to conduct said electrical power distributed by the electronic componentry to said at least one light source; and said at least one circuit board substrate comprises a first circuit board substrate on which said electronic componentry is mounted and a second circuit board substrate including said electrical connection means;

said backlighting system further comprising further electrical connection means provided between said first and second circuit board substrates.

2. A backlighting system as claimed in claim 1, wherein the light source is provided substantially in a display plane and the first circuit board substrate is substantially planar and positioned over the at least one light source substantially parallel with the display plane.

3. A backlighting system as claimed in claim 2, wherein the second circuit board substrate is arranged substantially perpendicularly to the plane of the first circuit board substrate and the display plane.

4. A backlighting system as claimed in claim 1, wherein said at least one light source comprises a plurality of tubular light sources having proximal and distal ends, the tubular light sources aligned in a row and substantially in the same plane as the first circuit board substrate, the distal ends of the plurality of tubular light sources connected together and to a ground connection of the electronic componentry and the proximal ends connected to receive electrical power from the electronic componentry through the electrical connection means.

5. A backlighting system as claimed in claim 1, wherein said first circuit board substrate includes at least one substantially straight edge adjacent to which said further electrical connection means is provided, the further electrical connection means including mechanical connection means provided on the first circuit board substrate along the substantially straight edge and including conductive pin means providing at least part of said further electrical connection means.

6. A backlighting system as claimed in claim 5, wherein said mechanical connection means comprise standard board to board connectors.

7. A backlighting system as claimed in claim 1, wherein the display apparatus is a multi-layer display.

8. A backlighting system as claimed in claim 1, wherein said electronic componentry includes a plurality of control means, each of which controls the distribution of power to more than one light source, each control means receiving feedback of the electrical power consumption of its selected number of light sources and adjusting the power supplied to the selected number of light sources accordingly.

9. A backlighting system for a display apparatus, said backlighting system comprising:

at least one light source;

electronic componentry adapted to receive electrical power and to control the distribution of electrical power to the at least one light source;

at least one circuit board substrate on which the electronic componentry is mounted and including an arrangement of conductive tracks; and electrical connection means provided in the circuit board substrate and connected to said conductive tracks, wherein said electrical connection means is directly electrically and physically connected to the at least one light source to conduct said electrical power distributed by the electronic componentry to said at least one light source; and said electronic componentry includes a plurality of control means, each of which controls the distribution of power to more than one light source, each control means receiving feedback of the electrical power consumption of its selected number of light sources and adjusting the power supplied to the selected number of light sources accordingly.

10. A backlighting system as claimed in claim 9, wherein the electronic componentry includes inverters, each control means controls more than one inverter and each inverter powers more than one light source.

11. A backlighting system as claimed in claim 9, further comprising cooling means and wherein said control means also receives feedback on a temperature within the display apparatus and adjusts the amount of cooling provided to at least said selected number of light sources by said cooling means accordingly.

12. A backlighting system for a display apparatus, said backlighting system comprising:

at least one light source;

electronic componentry adapted to receive electrical power and to control the distribution of electrical power to the at least one light source;

at least one circuit board substrate on which the electronic componentry is mounted and including an arrangement of conductive tracks, and a first electrical connection element provided in the circuit board substrate and connected to said conductive tracks;

wherein said first electrical connection element is directly electrically and physically connected to the at least one light source to conduct said electrical power distributed by the electronic componentry to said at least one light source; and said at least one circuit board substrate comprises a first circuit board substrate on which said electronic componentry is mounted and a second circuit board substrate including said first electrical connection element;

said backlighting system further comprising a second electrical connection element provided between said first and second circuit board substrates.

13. The backlighting system as claimed in claim 12, wherein the light source is provided substantially in a display plane and the first circuit board substrate is substantially planar and positioned over the at least one light source substantially parallel with the display plane.

14. The backlighting system as claimed in claim 12, wherein the second circuit board substrate is arranged substantially perpendicularly to the plane of the first circuit board substrate and the display plane.

15. The backlighting system as claimed in claim 12, wherein said at least one light source comprises a plurality of tubular light sources having proximal and distal ends, the tubular light sources aligned in a row and substantially in the same plane as the first circuit board substrate, the distal ends of the plurality of tubular light sources connected together and to a ground connection of the electronic componentry and the proximal ends connected to receive electrical power from the electronic componentry through the first electrical connection element.

16. The backlighting system as claimed in claim 12, wherein said first circuit board substrate includes at least one substantially straight edge adjacent to which said second electrical connection element is provided, the second electrical connection element including a mechanical connection element provided on the first circuit board substrate along the substantially straight edge and including a conductive pin providing at least part of said second electrical connection element.

17. The backlighting system as claimed in claim 16, wherein said mechanical connection element comprises standard board-to-board connectors.

18. The backlighting system as claimed in claim 12, wherein said electronic componentry includes a plurality of control elements, each of which controls the distribution of power to at least two light sources, receives feedback of the electrical power consumption of said respective at least two light sources, and adjusts the power supplied to said respective at least two light sources accordingly.

19. The backlighting system as claimed in claim 18, wherein the electronic componentry includes inverters, each said control element controls more than one of said inverters, and each said inverter powers more than one light source.

20. The backlighting system as claimed in claim 18, further comprising a cooling element and wherein each said control element also receives feedback on a temperature within the display apparatus and adjusts the amount of cooling provided to said respective at least two light sources by said cooling element accordingly.

* * * * *